(12) United States Patent
Drouard et al.

(10) Patent No.: US 11,362,266 B2
(45) Date of Patent: Jun. 14, 2022

(54) MAGNETO RESISTIVE MEMORY DEVICE

(71) Applicant: ANTAIOS, Meylan (FR)

(72) Inventors: Marc Drouard, Valence (FR); Jérémie Vigier, Le Sappey en Chartreuse (FR); Jérémy Brun-Picard, Sion (CH)

(73) Assignee: ANTAIOS, Meylan (FR)

( * ) Notice: Subject to any disclaimer, the term of this patent is extended or adjusted under 35 U.S.C. 154(b) by 0 days.

(21) Appl. No.: 17/179,084

(22) Filed: Feb. 18, 2021

(65) Prior Publication Data
US 2022/0029088 A1    Jan. 27, 2022

(30) Foreign Application Priority Data
Jul. 23, 2020  (EP) .................................. 20315358

(51) Int. Cl.
*H01L 43/04*   (2006.01)
*H01L 43/06*   (2006.01)
*H01L 27/22*   (2006.01)
*H01L 43/10*   (2006.01)

(52) U.S. Cl.
CPC ............ *H01L 43/04* (2013.01); *H01L 27/222* (2013.01); *H01L 43/06* (2013.01); *H01L 43/10* (2013.01)

(58) Field of Classification Search
CPC ........... H01L 27/222–228; H01L 43/04; H01L 43/06; H01L 43/10
See application file for complete search history.

(56) References Cited

U.S. PATENT DOCUMENTS

| | | |
|---|---|---|
| 2015/0129995 A1 | 5/2015 | Wang et al. |
| 2016/0300999 A1 | 10/2016 | Yi et al. |
| 2020/0098410 A1 | 3/2020 | Gosavi et al. |
| 2021/0202827 A1* | 7/2021 | Song .................... G11C 11/1655 |

FOREIGN PATENT DOCUMENTS

| | | |
|---|---|---|
| WO | WO2012014131 | 2/2012 |
| WO | WO2012014132 | 2/2012 |

* cited by examiner

*Primary Examiner* — Latanya N Crawford Eason
(74) *Attorney, Agent, or Firm* — Phillips Winchester

(57) ABSTRACT

A memory device may comprise a substrate defining a main plane; a plurality of memory cells each comprising a SOT current layer disposed in the main plane of the substrate and a magnetic tunnel junction residing on the SOT current layer; and a bit line and a source line to flow a write current in a write path including the SOT current layer of a selected memory cell. The source line comprises a conductive magnetic material providing a magnetic bias field extending to the magnetic tunnel junction of the selected memory cell for assisting the switching of the cell state when the write current is flowing.

15 Claims, 5 Drawing Sheets

MAGNETO RESISTIVE MEMORY DEVICE

FIELD

The present disclosure relates to a magneto resistive memory device.

BACKGROUND

WO2012014131 and WO2012014132 disclose the structure of a memory cell of a so-called SOT magneto resistive memory device and the general architecture of an array of such cells. In the configuration proposed in those documents, a magnetic source external to the memory cell is provided for generating a magnetic bias field to allow deterministic switching of the cell during a write operation.

FIG. 1 shows an example of such a memory cell, the memory cell 1 being disposed on a substrate S that defines a main plane. The memory cell 1 includes a magnetic tunnel junction structure 2 that includes a thin dielectric layer 2a sandwiched between a ferromagnetic free layer 2b and a ferromagnetic pinned layer 2c. The dielectric layer 2a forms a tunnel barrier layer between the pinned layer 2c and the free layer 2b. The orientation of the magnetization of the ferromagnetic pinned layer 2c is fixed, perpendicular to the substrate S main plane. The magnetization orientation of the free layer 2b is switchable in the perpendicular axis into one of a parallel state or an antiparallel state with respect to the magnetization orientation of the pinned layer 2b. The free layer may comprise material selected in the list constituted of Fe, Co, Ni, FeCo, CoNi, CoFeB, FeB, FePt, FePd or other suitable ferromagnetic material. The pinned layer 2c may comprise materials selected in the list constituted of Fe, Co, Ni, FeCo, CoNi, CoFEB, FeB, FePt, FePd or other suitable ferromagnetic material. Finally, the dielectric layer 2a may comprise MgO, Al2O3 or other suitable dielectric materials.

The resistance value between the pinned layer 2c and the free layer 2b is dependent on the actual state of the free layer magnetization orientation. When the free layer 2c and the pinned layer 2b have parallel magnetizations, the magnetic tunnel junction presents a relatively lower electric resistance, whereas in the antiparallel magnetizations the magnetic tunnel junction presents a relatively higher electric resistance. The switchable relative magnetization orientation of the free layer 2b defines therefore two states of the memory cell 1, to respectively represents the "0" and "1" values of a bit of information.

The memory cell of FIG. 1 also comprises a SOT current layer 3 disposed in the main plane of the substrate S, and on which resides the magnetic tunnel junction 1. The free layer 2b of the junction 1 is electrically coupled to the SOT current layer 3, for instance the free layer 2c may be in direct contact with a first face of the SOT current layer. The SOT current layer is made of conductive heavy metal layer such has Ta, W, Pt, Cu, Au or other suitable metal materials.

As described in the above cited document, the memory device also includes a magnetic source 4 providing a magnetic bias field extending to the magnetic tunnel junction 2. The magnetic bias field (whose amplitude is typically between 100 Oe to 1500 Oe) allows the deterministic switching of the free layer magnetization when a write current is flowing in the SOT current layer. It is important to control the amplitude and homogeneity of this field in the free layer, such that an intended state, "0" or "1", may be reliably be stored into a junction 2.

In a read operation, a signal from a read word line RWL, turns on a read transistor RT to flow a read current between a bit line BL and a source line SL through the magnetic tunnel junction 2. By sensing the read current, it is possible identify electric resistance of the magnetic tunnel junction, which is dependent on the relative orientation of the magnetization of the pinned layer 2c and of the free layer 2b as mentioned above, and hence of the state store in the memory cell.

In a write operation, a signal from a write word line WWL turns on a first write transistor WT to flow a write current between the bit line BL and the source line SL in a write path including the SOT current layer of the selected memory cell. The current flowing in the SOT current layer generates a spin-orbit torque originating from a spin Hall effect and/or a Rashba effect that aim at changing the magnetization orientation of the free layer 2b. It is possible to write the MTJ in one configuration by passing a current in one direction (for instance from the bit line BL to the source line SL) and by reversing the current direction (for instance from the source line SL to the bit line BL) it is possible to write the MTJ in the other configuration.

To provide a functional magneto resistive memory device, a large number of the memory cell represented on FIG. 1 are provided in rows and columns on the substrate. Bit lines and sources lines are arranged along respective columns of memory cells; read word lines RWL and write word lines are arranged along respective rows of memory cells. As this is conventional in a random access memory, a row of memory cells may be collectively written, by activating the corresponding word line, after the bit lines and sources lines have been pre-charged such that the writing current flows in the direction allowing to set the target state of the memory cell.

SUMMARY

The large-scale integration of such a SOT magneto resistive memory device may require improvements to the architecture proposed in the state of the art just outlined above. In general terms, embodiments of the disclosure propose such an architecture that allows the formation of a SOT magneto resistive memory device that is compact (for a given storage capacity), has low power consumption and dissipation, and easy to fabricate. More specifically, embodiments of the disclosure aim at improving the amplitude and/or the homogeneity of the magnetic bias field extending to a magnetic junction of a memory cell, and across the memory cells in the device, such that deterministic switching of the junctions may be reliably be obtained.

To this effect, embodiments of the disclosure may relate to a memory device comprising:
- a substrate defining a main plane;
- a plurality of memory cells each comprising a SOT current layer disposed in the main plane of the substrate and a magnetic tunnel junction residing on the SOT current layer;
- a bit line and a source line to flow a write current in a write path including the SOT current layer of a selected memory cell.

According to embodiments of the disclosure, the source line comprises a conductive magnetic material providing a magnetic bias field extending to the magnetic tunnel junction of the selected memory cell for assisting the switching of the cell state when the write current is flowing According to further non-limitative features of embodiments of the disclosure, either taken alone or in any technically feasible combination:

the memory cells are arranged on the substrate to form a first column and the source line extends along the first column of memory cells;

the source line comprises a first line made of the magnetic conductive material and a second line, electrically connected to the first line, made of conductive non-magnetic material;

the first and second lines are disposed in respective planes parallel to the main plane, and are electrically connected by a plurality of conductive vias;

the memory device further comprises a second column of memory cells parallel to the first column of memory cells, the source line extending in-between the first and the second column;

the SOT current layer of each memory cell is contacting the first line;

the first line is configured as a single strip, and the SOT current layers of the first and second column of memory cells are respectively contacting two opposed lateral sides of the single strip;

the first line is configured as two parallels strips, each strip being connected to the second line by a plurality of conductive vias, and the SOT current layers of the first and second column of memory cells are respectively contacting the two parallels strips;

the memory device further comprises a plurality of enhancing patterns made of conductive magnetic material, each enhancing patterns being disposed in a write path between the bit line and the SOT current layer of a memory cell, in electrical contact with this layer;

the enhancing pattern is presenting a magnetization parallel to the magnetization of the source line and wherein, for each memory cell, the magnetic tunnel junction is residing on a first face of the SOT current layer, an enhancing pattern and the source line electrically contacting a second face of the SOT current layer, opposing the first face;

the memory device further comprises an additional line and/or an additional pattern both made of magnetic material, disposed on the first face of the SOT current layer;

each enhancing pattern is presenting a magnetization parallel to the magnetization of the source line and wherein, for each memory cell, an enhancing pattern and the source line are respectively contacting the two lateral sides of the SOT current layer;

for each memory cell, and enhancing block is disposed on the magnetic tunnel junction and is presenting a magnetization antiparallel to the magnetization of the magnetic material of the source line;

the magnetic bias field is extending parallel to the main plane;

the magnetic bias field is extending perpendicular to the main plane.

FIGURES

Many other features and advantages of embodiments of the disclosure will become apparent from reading the following detailed description, when considered in conjunction with the accompanying drawings, in which.

DETAILED DESCRIPTION

In order to simplify the following description, the same references shall be used for like elements or elements performing the same function in the prior art or in the various presented embodiments of the disclosure. To keep the representations simple, only the elements relevant to the description of embodiments of the disclosure have been included in the figures. The represented memory device may comprise further elements not included into the figures, notably the elements involved in a read operation of the device memory cells.

Figure 1:
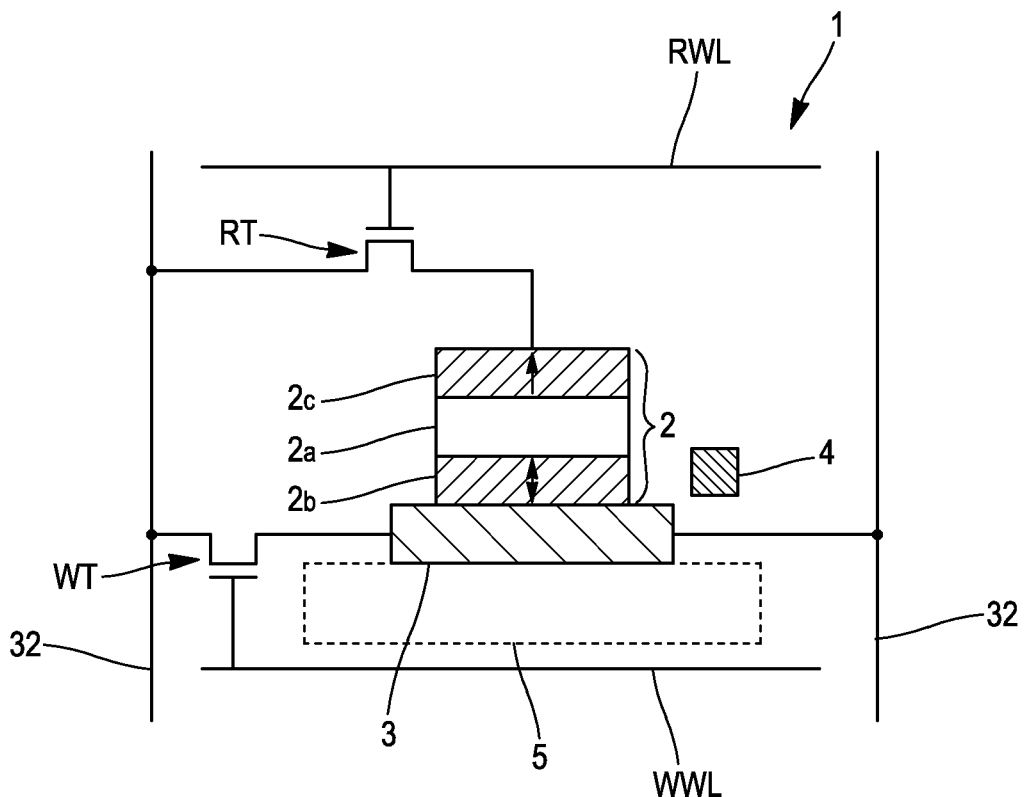
FIG. 1 represents a SOT magneto resistive memory cell of the prior art.
Figure 2A:
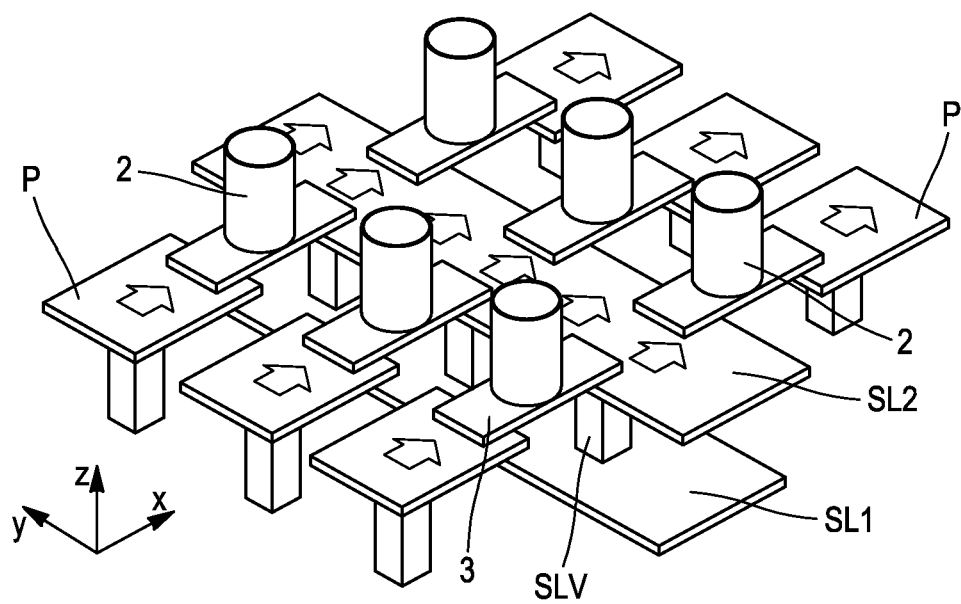
FIGS. 2a and 2b represent different views of a memory device according to a first embodiment.
Figure 2B:
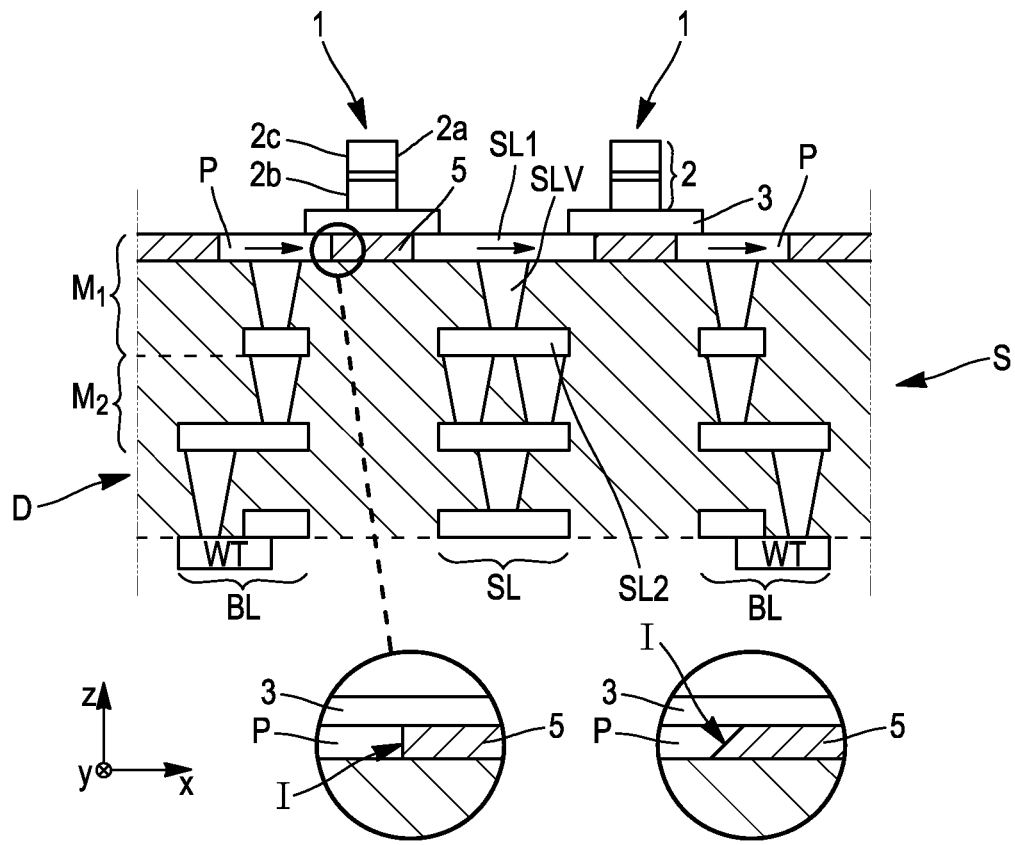

FIGS. 2a and 2b represent different views of a memory device according to a first embodiment. In this embodiment, a plurality of memory cells 1 are arranged on a substrate S, for instance a silicon substrate. The substrate S has been processed conventionally, for instance according to the CMOS technology, to incorporate the electronic circuit of the memory device (row and column decoder, sense amplifier, read/write circuit . . . ). The substrate S is provided with a plurality of interconnect layers M1, M2 comprising conductive lines and vias, for instance made of aluminum or copper, buried into a dielectric D such as silicon dioxide to electrically connect the electronic circuit to the memory cells 1. The substrate S is defining a main plane extending in the x and y directions as represented in the figures.

The memory device comprises an array of cells 1, arranged in rows and columns, each cell comprising a SOT current layer 3 disposed in the main plane of the substrate S and a magnetic tunnel junction 2 residing on a first face of the SOT current layer 3. As described in the introduction of this document, the SOT current layer 3 is contacting on its first face a free layer 2b of the magnetic tunnel junction 2, such that a write current flowing into the SOT current layer 3 generates a spin-orbit torque originating from a spin Hall effect and/or a Rashba effect. The spin orbit torque generated by passing a current through the SOT current layer 3 is able to affect the magnetization orientation of the free layer 2b of the junction 2. The SOT current layer 3 can be in direct contact with the free layer 2 or, alternatively, a thin separating layer (for instance of MgO) can be provided between the current layer 3 and the free ferromagnetic 2b.

The orientation of the magnetization of the ferromagnetic pinned layer 2c is fixed, perpendicular to the substrate S main plane. The magnetization orientation of the free layer 2b is switchable in the perpendicular axis into one of a parallel state or an antiparallel state with respect to the magnetization orientation of the pinned layer 2c. Ferromagnetic layers 2b, 2c materials can comprise FePt, FePd, CoPt, or a rare earth/transition metal alloy, in particular GdCo, TdFeCo, or Co, Fe, CoFe, Ni, CoNi, CoFeB, FeB. Their thicknesses may extend between 0.5 nm and 10 nm and preferably between 1 and 3 nm. In the representation of FIG. 2a, the magnetic tunnel junction 2 presents a circular cross-section along a plane perpendicular to the main plane. But, more generally, the junction may present a cross-section of any shape, such as an elliptical, a square or a rectangular shape. Its dimension in the main plane (diameter, major axis, side or length) can typically range between 5 nm and 1 micron, preferably between 30 nm and 60 nm. The magnetic tunnel junction structure 2 also includes a thin dielectric layer 2a sandwiched between a ferromagnetic free layer 2b and a ferromagnetic pinned layer 2c. The dielectric layer 2a forms a tunnel barrier layer between the pinned layer 2c and the free layer 2b, and may be formed of, or comprise, MgO, Al2O3 or other suitable dielectric materials. Its thickness can range between 0.1 nm to 3 nm, preferably between 0.5 to 2 nm.

The SOT current layer 3 is represented here of rectangular shape, its width and length being sufficient to support entirely the junction 2, but other shapes are also possible. The SOT current layer 3 has a thickness that ranges between 0.5 nm and 200 nm, more particularly between 0.5 nm and 100 nm, or less than 10 nm. Preferably, the SOT current layer 3 has thickness lying in the range 0.5 nm to 5 nm. Advantageously, the thickness of the SOT current layer is selected to be thin, such as the write current density flowing into this layer is relatively higher than the write current density flowing in other sections of the write path. SOT current layer 3 is usually made of a conductive heavy metal, which can include Ta, Bi, Pt, W, Ir, Ru, Pd, Cu, Au, Bi, Hf, Se, Sb or of an alloy of these elements. The SOT current layer 3 may also be made of, or comprise, a topological insulator such as Bi2Se3, Bi2Te3, Sb2Te3 or Bi1-xSbx, Bi1.1Sb0.9Te2S.

Optionally, the magnetic tunnel junction 3 may also comprise a capping layer disposed on and in contact with the pinned layer 2c, for instance for helping in maintaining the magnetization of the pinned layer 2c. Capping layer may present a thickness comprised between 1 nm and 200 nm, and preferably between 30 nm to 100 nm. The capping layer may be formed of antiferromagnetic material, such a PtMn or IrMn, or may consist in a more complex arrangement, such as a synthetic antiferromagnet (SAF) multilayer structure. Capping material may also be formed of hard mask material used during manufacturing of the memory device.

Referring back to the FIGS. 2a, 2b, the memory device of this embodiment also comprises bit lines BL and a source line SL to flow a write current in the write path including the SOT current layer 3 of (a) selected memory cell(s). In the architecture of this embodiment, the source line SL is disposed along and in-between a first and a second column of memory cells 1, adjacent to a first side of the two columns. Two bit lines BL are disposed along the two columns of memory cells 1 on their opposing sides with respect to the source line SL, and parallel to the source line SL. Generally speaking the bit lines BL and the source line SL are presenting a lower resistance than the SOT current layer 3.

In the represented example, the bit lines BL are buried into the substrate S. They are electrically connected to the SOT current layer 3 through a write circuit SW including a selection switch, as described in the introduction of this application, and comprise vias and interconnect layers to guide the write current to the SOT current layer 3. In an alternative, the bit lines BL are not buried in the substrate S, but are disposed in an additional interconnect layer for instance disposed on top of the substrate S, that may reside above the magnetic junction 2.

A plurality of optional enhancing patterns P made of conductive magnetic material is formed on the substrate S and disposed in the write path between the bit line and the respective SOT current layer 3. Each enhancing pattern P is in direct contact with a SOT current layer of a memory cell 1 and, in the represented embodiment, with a via of the bit line BL. The enhancing patterns P are contacting a second face of the SOT current layer, this second face opposing the first face onto which the junction 2 resides. The enhancing patterns P are forming isolated islands of conductive magnetic material disposed on the surface of the substrate S, such that an enhancing pattern associated, and in contact with, a SOT current layer 3 of a memory cell 1 is not contacting another enhancing pattern P in contact and associated with another memory cell 1. The shape, in the main plane, of each enhancing pattern P may be identical or different to each other's and may be freely chosen. When the enhancing pattern P are not provided, the SOT current layer is contacting directly the bit line BL, for instance by contacting directly, by its second face, a conductive via of the bit line BL.

In the represented embodiment, the source line SL comprises a first line SL1 made of the magnetic conductive material and a second line SL2, electrically connected to the first line, made of conductive non-magnetic material. The first and second lines SL1, SL2 are disposed in respective planes parallel to the main plane, and are electrically connected by a plurality of conductive vias SLv. The first line SL1 of this particular embodiment is configured as a single strip of material disposed on the substrate S, along at least a column of memory cell and in-between two columns of memory cells in the representation of FIGS. 2a, 2b. The strip of magnetic conductive material may present a width typically comprised between 30 nm and 1 micron, preferably between 50 nm and 150 nm. The SOT current layers 3 of the first and second column of memory cells 1 are respectively contacting, by their second faces opposing the first face supporting the junctions 2, two opposed lateral sides of the single strip.

By providing such a configuration, the resistance associated with the source line SL is therefore lower than conventional architecture. Said differently, the write current density that flows in the source line SL is less than the write current density of a conventional source line, formed of a unique electrically conductive and non magnetic line.

Enhancing patterns P (when present) and the first line SL1 of the source line are forming the hard magnets generating the magnetic bias field to allow deterministic switching of the cells 1 during a write operation. The enhancing patterns P and the first line SL1 may for instance be made of a metal or alloy comprising: Co, Fe, CoFe, Ni, NiFe, CoNi, CoCrPt, CoPt, CoCrTa, CoSm or any combination of these metals or alloys. The enhancing patterns P and the first line SL1 may present a thickness comprised between 5 nm and 50 nm. Generally speaking their thickness is selected such as to provide a magnetic bias field of sufficient amplitude, along the x direction (typically comprised between 100 Oe and 1500 Oe) and to keep the resistance relatively low. Depending on the material selected to form the enhancing patterns P and the first line SL1, and depending on the process condition of their formation, the magnetic bias field is selected to extend parallel to the main plane or to extend perpendicular to the main plane. In the represented embodiment, the enhancing pattern P is presenting a magnetization parallel to the magnetization of the first line SL1, parallel to the substrate S.

According to the particular configuration presented in this embodiment, a write current flowing between the bit line BL and the source line SL is progressing along a write path that includes in succession (in one direction or the other depending on the nature of the state to be stored in the selected memory cell) the enhancing pattern P, the SOT current layer 3 and the first line SL1 of the source line. The magnetic bias field established by the first line SL1 of the source line and, when present, by the enhancing patterns P extends to the free layer of the magnetic tunnel junction 2 of the selected memory cell for assisting the switching of the cell state when the write current is flowing.

Advantageously, the enhancing patterns P are not directly contacting the first line SL1 of the source line. Instead, a dielectric material 5 such as silicon dioxide or silicon nitride is disposed on the substrate S, under the SOT current layer 3, to electrically separate the enhancing pattern P and the first line SL1. This enables to increase the current density circulating into the SOT current layer 3 by confining the circulation of this current into the SOT current layer 3. This allows to enhance, for a given write current intensity, the SOT effect on the magnetic tunnel junction 2. For instance, the current density of a write current circulating in the SOT current layer may be comprised between $10^5$ A/cm$^2$ to $10^9$ A/cm$^2$.

The memory device of this first embodiment is presenting many advantages. The magnetic bias field is provided by the source line SL running along a column of memory cells 1. The large dimension of this magnetic line provides a magnetic bias field of large amplitude, able to reliably break the symmetry in the junction 2 allowing a deterministic switching. Additionally, because of the continuous extension of the source line, the magnetic bias field is particularly homogenous along the line. When the magnetic and conductive source line SL1 is assisted by a conductive and magnetic pattern P to generate the bias field, the latter extend principally in a plane parallel to the main plane, very uniformly and completely across the free layer of the magnetic junction 2, which features also contribute to the reliability of the write operation. As a single magnetic source line SL is shared for a plurality of columns in the array to provide the magnetic bias field, the device may be kept compact, as no additional magnet is necessary. Additionally, in the memory device architecture of this embodiment, the resistance of the source line SL is reduced, and more generally the resistance of the write path is reduced, which improve power consumption and speed of operation of the memory device.

Many variations may be realized from this first embodiment. For instance, the source line SL may be shared between more than two columns of memory cells 1 or a source line SL may be dedicated to each single column of memory cells 1. Similarly, more than one bit line BL may be provided along each column of memory cells, the memory cells being respectively connected to one or the others of the bit lines. Obviously, a complete memory device typically comprises a large number of columns, each memory cell being however electrically connected to one bit line and one source line to define one write path.

In the particular embodiment represented on FIG. 2a, and as shown in the first insert of this figure, the interfaces I between dielectric material 5, the enhancing pattern P and the first line SL, are made of the lateral sides of those elements. They are presenting an angle of substantially 90° relative to the main plane of the substrate S. In a variant, to improve the homogeneity of the bias field along the z direction, represented in the second insert of FIG. 2a, these interfaces I may exhibit a slope angle different from 90°. For example, the interface can make an angle comprised between 20° and 90°, preferably between 60° and 80°, relative to the main plane.

Figure 3:
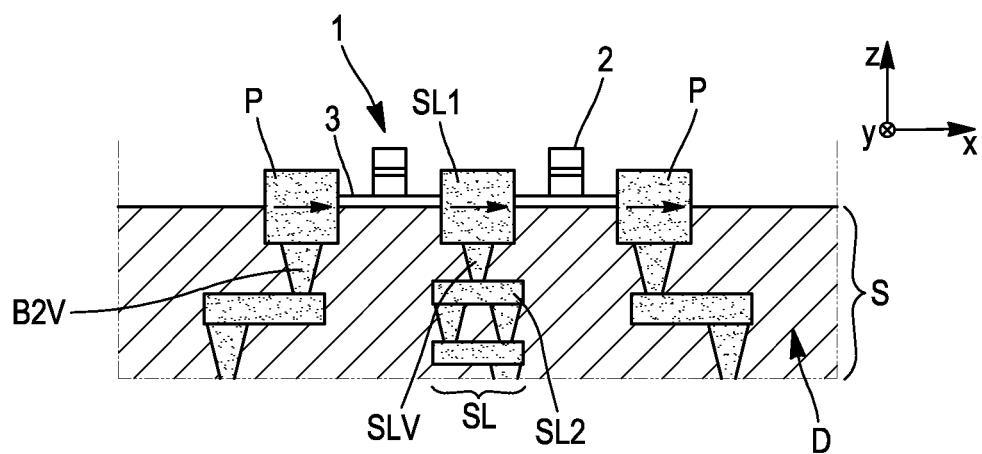
FIG. 3 represents the architecture of a memory device according to a second embodiment.

FIG. 3 represents the architecture of a memory device according to a second embodiment. In this embodiment, the SOT layers 3 are contacting the substrate S, and enhancing patterns P and first source line SL1 are not disposed under the SOT layers 3, but are juxtaposed to those layers. Electrical contacts between the enhancing patterns P, SOT layers 3 and the first source line are achieved on the lateral sides of these elements. The dielectric layer D at the surface of substrate S may be slightly etched to expose the vias BLv, SLv, before the enhancing pattern P and the magnetic and conductive source line SL1 are formed, such that these layers and the SOT layer 3 are not contacting the substrate along a same plane. In case the enhancing patterns P are omitted, the conductive vias BLv extending from the bit line may directly emerge under the SOT layers 3 and contact their second faces, in contact with the dielectric D of the substrate S. This embodiment presents the advantages of providing a magnetic bias field of large amplitude along the x direction, and homogenous along the z direction. Also, this configuration is more resilient to misalignment of the various elements that may occur during the manufacturing process.

Figure 4:
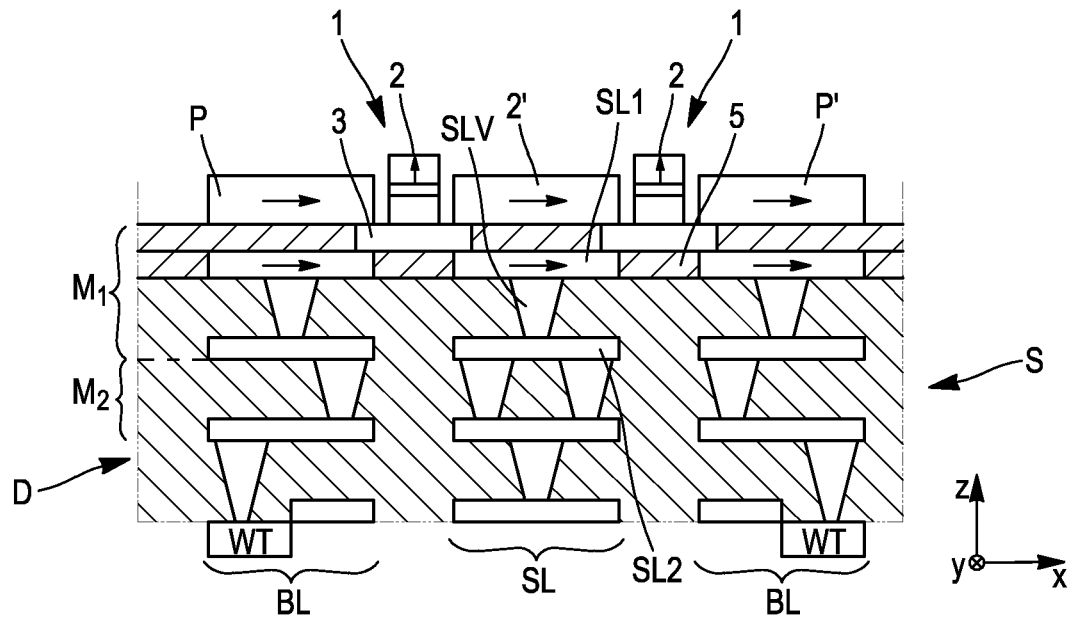
FIGS. 4 to 7 represent the architecture of a memory device according to further embodiments.

FIG. 4 represent a further embodiment of the memory device according to embodiments of the disclosure, that improves on the configuration of FIG. 2a. In this embodiment, a memory cell 1 configured according to the first embodiment is provided with an additional enhancing pattern P'. The additional enhancing pattern P' is made of magnetic material. It is disposed next to the junction 2 on the first face of the SOT current layer 3, and is opposing the enhancing pattern P that is contacting the second face of the SOT layer 3. In other terms, a side portion of the SOT current layer 3 is sandwiched between the enhancing pattern P and additional enhancing pattern P'. The magnetic material forming the additional enhancing pattern P' may be the same as the conductive magnetic material of the enhancing pattern P, or it may be different. It is not necessary that this material is conductive. For instance, and without limitation, the additional enhancing pattern P' may be made of, or comprised, ferromagnetic insulators such as Cr2Ge2Te6, EuO or YCaTiO3.

Similarly, a memory cell 1 according to the embodiment of FIG. 4 is provided with an additional line L', made of magnetic material, disposed on the first face of the SOT current layer 3, next to the junction 2 and opposing the first line SL1 that is contacting the second face of the SOT layer 3. In other terms, a side portion of the SOT current layer 3 is sandwiched between the first source line SL1 and the additional line L'. The material forming the additional line may be selected to be identical to the first source line or to the pinned layer, but generally speaking this material is not necessarily be conductive and may be made of a magnetic material different from the material of the first source line SL1.

The magnetization of the additional enhancing block P' and of the additional line L' is preferably parallel to the magnetization of the first source line SL1, and parallel to the main plain. These additional elements P', L' contribute to providing a magnetic bias field of large amplitude along the x direction, and homogenous along the z direction.

To avoid unwanted electrical shorts, the additional enhancing block P' and the additional line L' are spaced apart from the lateral sides of the junction 2. The distance separating a lateral side of such an element P', L' to the lateral side of a junction 2 may be comprised between 1 to 50 nm.

It is also not necessary to provide both an additional enhancing pattern P' and an additional line L', and in some embodiments a memory device may only incorporate one of the two additional elements, both of them or none of them. The dimension of the additional enhancing pattern P' and of the additional line L' may corresponds to or differ from the dimensions of the enhancing pattern P and of the first line SL1. The thickness of the additional elements P', L' may for instance be comprised between 1 to 100 nm, their width (along the x direction) comprised between 5 to 500 nm, and their length (along the y direction) comprised between 5 to 500 nm.

Figure 5:
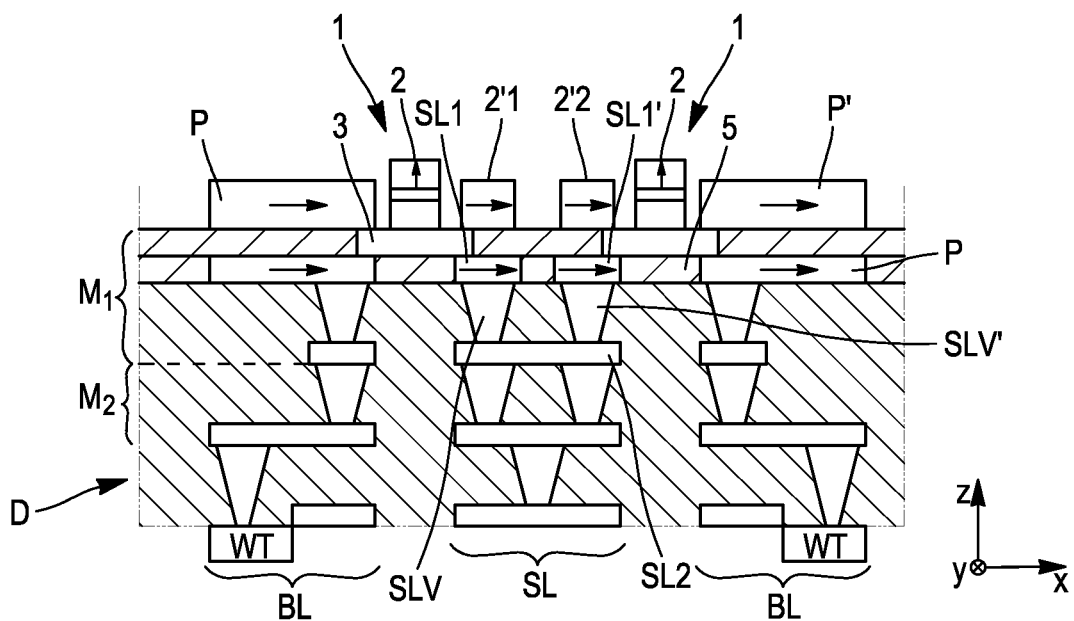

In an alternative to the configuration presented on FIG. 4 where the first source line SL1 is configured as a single strip, it is possible to form the first line SL1 as two parallels strips SL1, SL1', as described above. This configuration is represented in FIG. 5. In such a case the SOT current layers 3 of the first and second column of memory cells 1 are respectively contacting the two parallels strips SL1, SL1', each being in electrical contact with the second source line SL2 by their respective vias SLv, SLIT. In the configuration of FIG. 5, the additional line is made of two distinct magnets L1', L2'. Such an additional line made of two magnets L1', L2' is also compatible with a first source line SL1 configured as a single strip, as in FIG. 4.

Also, in the embodiment of FIG. 4, the additional elements P', L' are directly contacting the SOT current layer 3. But it is absolutely possible to interpose a spacer layer in-between the additional elements P', L' and the SOT current layer 3. The spacer layer may be made of a dielectric material such as silicon dioxide or a nitride. Generally speaking, the thickness of the spacer layer is chosen such that the magnetic field that extend across the junction 2 is as uniform as possible in the free layer 2b. This thickness may be comprised between 1 to 20 nm. Ideally, the junction layer should be biased symmetrically by the magnetic field generated by the additional elements P', L' and by the magnetic field generated by the enhancing patterns P and the first source line L.

Figure 6:
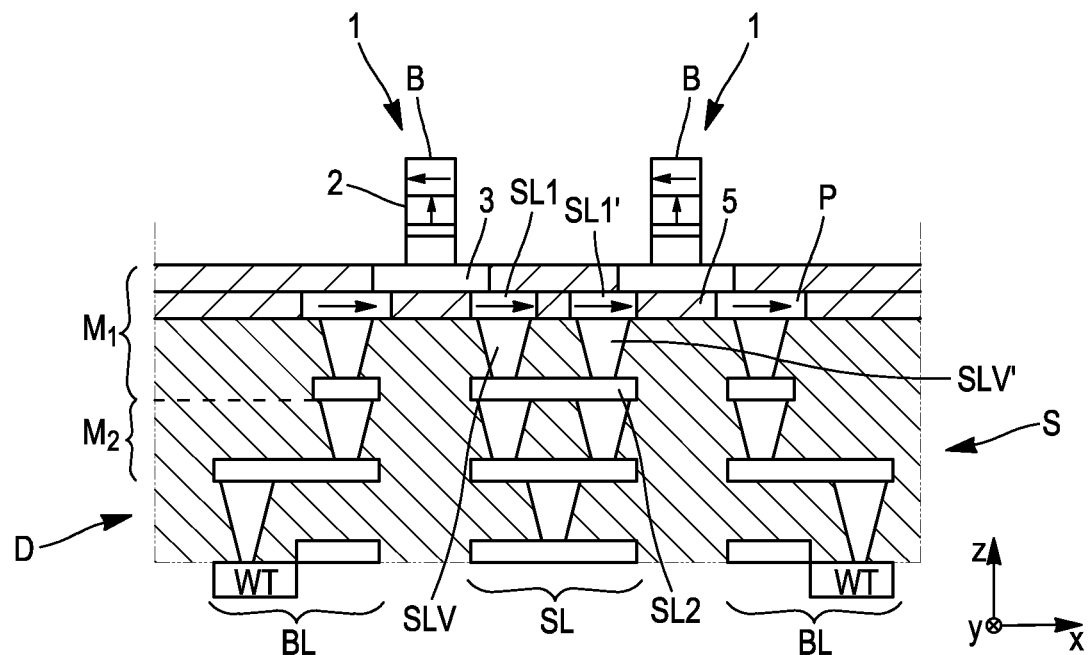

FIG. 6 represents a further embodiment wherein, for each memory cell 1, and enhancing block B made of magnetic material is disposed on the magnetic tunnel junction 2. The enhancing block B is presenting a magnetization antiparallel to the magnetization of the magnetic material of the first line SL1 of the source line. Again, this configuration helps in providing a bias magnetic field of good uniformity along the z axis.

Figure 7:
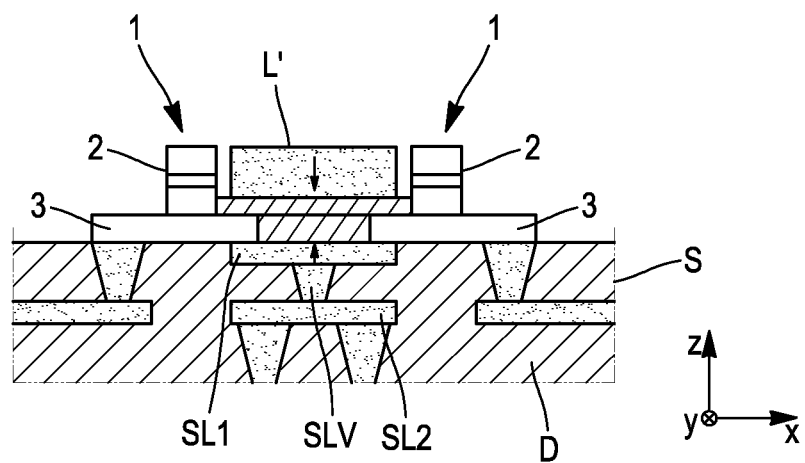

FIG. 7 represents a SOT memory device according to another embodiment. In this embodiment, the SOT current layers 3 reside on the substrate S, their second faces respectively in contact with a via BLv on the side of the bit line, and with the first line SL1 made of magnetic conductive material on the side of the source line. The junctions 2 of the memory cells 1 resides on the first face of the SOT current layers 3. An additional line L' made of magnetic material, is disposed on the first face of the SOT current layer 3, next to the junctions 2 and opposing the first line SL1. In the embodiment represented in this figure, the magnetizations of the first line SL1 and of the additional line L' are along the z direction, perpendicular to the main plane, but in two opposite directions. The magnetic biasing of the two junctions 2 on each side of the additional line are therefore in opposite directions, leading to the writing of opposite states in the two junctions when a write current is flowing in an identical direction. This however can be compensated at the electronic level of the memory device, for instance by providing inverting sense amplifier in the read circuit of one of the two junctions. This configuration also enhances the uniformity of the biasing magnetic field across the z direction, and improves the amplitude of this field along the x direction.

Other variations to the disclosed embodiments can be understood and effected by those skilled in the art in practicing the claimed invention, from a study of the drawings, the disclosure, and the appended claims.

Figure 8:
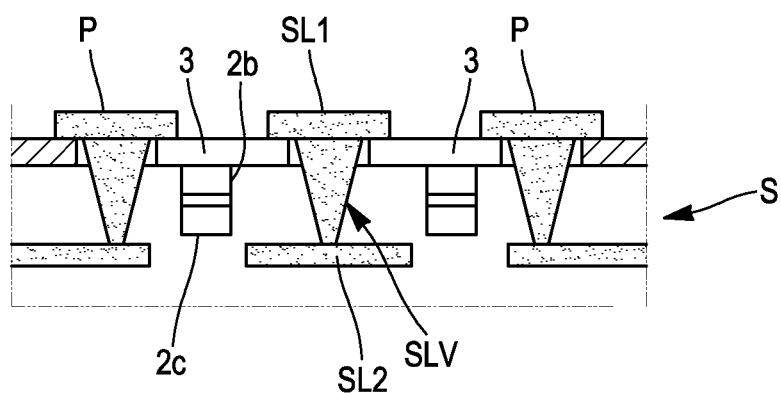
FIG. 8 represents a memory device with a reverse junction structure.

In particular, in all presented embodiments, the junction may be reversed, i.e. by having the free layer 2a on top of the pinned layer, along the z direction. In such configuration, represented on FIG. 8, the first face of the SOT current layer 3 is oriented toward the substrate S and the second face oriented in the opposite direction.

The memory device described in the various embodiment of this disclosure may be manufactured using conventional deposition steps and photolithographic steps to successively elaborate the various layers and patterns forming the stacks represented in the figures. The substrate S onto which the stacks of material is formed usually comprises part of the electronic circuits of and metallization's levels M1, M2 necessary to make the overall device functional.

The invention claimed is:

1. A memory device comprising:
a substrate (S) defining a main plane;
a plurality of memory cells (1) each comprising a SOT current layer (3) disposed in the main plane of the substrate (S) and a magnetic tunnel junction (2) residing on the SOT current layer (3);
a bit line (BL) and a source line (SL) to flow a write current in a write path including the SOT current layer (3) of a selected memory cell (1);
wherein the source line (SL) comprises a conductive magnetic material providing a magnetic bias field extending to the magnetic tunnel junction (2) of the selected memory cell (1) for assisting the switching of the cell state when the write current is flowing.

2. Memory device according to claim 1, wherein the memory cells (1) are arranged on the substrate to form a first column and the source line (SL) extends along the first column of memory cells.

3. Memory device according to claim 1, wherein the source line (SL) comprises a first line (SL1) made of the magnetic conductive material and a second line (SL2), electrically connected to the first line (SL1), made of conductive non-magnetic material.

4. Memory device according to claim 1, wherein the first and second lines (SL1, SL2) are disposed in respective planes parallel to the main plane, and are electrically connected by a plurality of conductive vias (SLv).

5. Memory device according to claim 3, further comprising a second column of memory cells (1) parallel to the first column of memory cells (1), the source line (SL) extending in-between the first and the second column.

6. Memory device according to claim 1, wherein the SOT current layer (3) of each memory cell (1) is contacting the first line (SL1).

7. Memory device according to claim 6, wherein the first line (SL1) is configured as a single strip, and the SOT current layers (3) of the first and second column of memory cells (1) are respectively contacting two opposed lateral sides of the single strip.

8. Memory device according to claim 6, wherein the first line (SL) is configured as two parallels strips, each strip being connected to the second line (SL2) by a plurality of conductive vias, and the SOT current layers (3) of the first and second column of memory cells (1) are respectively contacting the two parallels strips.

9. Memory device according to claim 6, further comprising a plurality of enhancing patterns (P) made of conductive magnetic material, each enhancing patterns (P) being disposed in a write path between the bit line (BL) and the SOT current layer (3) of a memory cell (1), in electrical contact with this layer (3).

10. Memory device according to claim 9, wherein the enhancing pattern (P) is presenting a magnetization parallel to the magnetization of the source line (SL) and wherein, for each memory cell (1), the magnetic tunnel junction (2) is residing on a first face of the SOT current layer (3), an enhancing pattern (P) and the source line (SL) electrically contacting a second face of the SOT current layer (3), opposing the first face.

11. Memory device according to claim 10, further comprising an additional line (L') and/or an additional pattern (P') both made of magnetic material, disposed on the first face of the SOT current layer (3).

12. Memory device according to claim 9, wherein the each enhancing pattern (P) is presenting a magnetization parallel to the magnetization of the source line (SL) and wherein, for each memory cell (1), an enhancing pattern (P) and the source line (SL) are respectively contacting the two lateral sides of the SOT current layer (3).

13. Memory device according to claim 6, wherein for each memory cell (1), and enhancing block (B) is disposed on the magnetic tunnel junction (2) and is presenting a magnetization antiparallel to the magnetization of the magnetic material of the source line (SL).

14. The memory device according to claim 1, wherein the magnetic bias field is extending parallel to the main plane.

15. The memory device according to claim 1, wherein the magnetic bias field is extending perpendicular to the main plane.

* * * * *